US012609701B2

(12) United States Patent
Zhu et al.

(10) Patent No.: US 12,609,701 B2
(45) Date of Patent: Apr. 21, 2026

(54) CLOCK RECEIVING CIRCUIT AND ELECTRONIC DEVICE

(71) Applicant: SANECHIPS TECHNOLOGY CO., LTD., Shenzhen (CN)

(72) Inventors: Wentao Zhu, Shenzhen (CN); Yunfeng Chang, Shenzhen (CN); Hao Luo, Shenzhen (CN); Yuhu Chen, Shenzhen (CN); Haipeng Zhu, Shenzhen (CN); Yumei Diao, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 220 days.

(21) Appl. No.: 18/575,154

(22) PCT Filed: Mar. 2, 2022

(86) PCT No.: PCT/CN2022/078778
§ 371 (c)(1),
(2) Date: Dec. 28, 2023

(87) PCT Pub. No.: WO2023/273377
PCT Pub. Date: Jan. 5, 2023

(65) Prior Publication Data
US 2024/0356551 A1    Oct. 24, 2024

(30) Foreign Application Priority Data

Jun. 30, 2021    (CN) ......................... 202110738327.9

(51) Int. Cl.
*H03K 19/0185*    (2006.01)
*H03L 7/08*    (2006.01)
*H03M 1/00*    (2006.01)

(52) U.S. Cl.
CPC ........ *H03K 19/018507* (2013.01); *H03L 7/08* (2013.01); *H03M 1/00* (2013.01)

(58) Field of Classification Search
CPC ... H03K 19/018528; H03K 19/018507; H03K 5/1565; H03K 19/0185; H03K 19/0175; H03K 19/00; H03K 5/156; H03K 5/00
See application file for complete search history.

(56) References Cited

U.S. PATENT DOCUMENTS 7,400,173 B1    7/2008  Kwong et al.
2004/0174215 A1*  9/2004  Li ....................... H03F 3/45219
                                                    330/253
(Continued)

FOREIGN PATENT DOCUMENTS

CN    113014232 A    6/2021
JP    S5793721 A    6/1982
(Continued)

OTHER PUBLICATIONS

European Patent Office, the Extended European Search Report dated May 26, 2025, for corresponding EP application No. 22831208.8.
(Continued)

*Primary Examiner* — Diana J. Cheng
(74) *Attorney, Agent, or Firm* — Li & Cai Intellectual Property (USA) Office

(57) ABSTRACT

Provided in the present disclosure is a clock receiving circuit. The clock receiving circuit comprises a common-mode voltage adjustment module, an amplitude amplification module and a level conversion module. The common-mode voltage adjustment module comprises an n-type signal conversion unit, a high-level n-type signal output end, a low-level n-type signal output end, a p-type signal conversion unit, a high-level p-type signal output end and a low-level p-type signal output end. The amplitude amplification module comprises a p-type current source transistor, an n-type current source transistor, a p-type transistor differential pair, an n-type transistor differential pair and a bias
(Continued)

control unit. The level conversion module is used for converting, into a CMOS level signal, a CML level signal which is output by the amplitude amplification circuit. Further provided in the present disclosure is an electronic device comprising the clock receiving circuit.

13 Claims, 3 Drawing Sheets

(56)                   References Cited

U.S. PATENT DOCUMENTS

| | | | |
|---|---|---|---|
| 2006/0066393 A1* | 3/2006 | Davis ............ | H03K 19/018528 |
| | | | 327/563 |
| 2012/0015617 A1 | 1/2012 | Srivastava et al. | |

FOREIGN PATENT DOCUMENTS

| | | | |
|---|---|---|---|
| JP | 2000031810 A | 1/2000 |
| JP | 2000174568 A | 6/2000 |
| JP | 2014171084 A | 9/2014 |
| JP | 2020524479 A | 8/2020 |

OTHER PUBLICATIONS

Japan Patent Office, the first Office action dated Dec. 3, 2024, for corresponding JP application No. 2023-579856.

* cited by examiner

CLOCK RECEIVING CIRCUIT AND ELECTRONIC DEVICE

CROSS REFERENCE TO RELATED APPLICATIONS

The present disclosure claims the priority to Chinese Patent Application No. 202110738327.9 entitled "CLOCK RECEIVING CIRCUIT AND ELECTRONIC DEVICE" and filed with the CNIPA on Jun. 30, 2021, the contents of which are incorporated herein by reference in their entirety.

TECHNICAL FIELD

Embodiments of the present disclosure relate to, but are not limited to, the field of integrated circuits, and in particular, to a clock receiving circuit and an electronic device including the same.

BACKGROUND

With the evolution of manufacturing processes of Complementary Metal Oxide Semiconductor (CMOS) and the improvement of design level, an operating frequency of an integrated circuit becomes higher and higher; and since attenuation of a high-speed clock in a transmission process is more serious and is more susceptible to non-ideal factors such as noise and mismatch, performance of the clock is reduced. Therefore, a clock receiving circuit is particularly important in a high-speed circuit.

FIG. 1 shows a clock receiving circuit in the related art, wherein the clock receiving circuit adopts a Current Mode Logic (CML) structure to receive and amplify an input clock. Such a clock receiving circuit has relatively large phase noise and relatively high power consumption.

SUMMARY

The present disclosure provides a clock receiving circuit and an electronic device including the same.

In a first aspect of the present disclosure, an embodiment of the present disclosure provides a clock receiving circuit, including a common-mode voltage adjustment module, an amplitude amplification module, and a level conversion module, wherein the common-mode voltage adjustment module includes an n-type signal conversion unit, a high-level n-type signal output terminal, a low-level n-type signal output terminal, a p-type signal conversion unit, a high-level p-type signal output terminal, and a low-level p-type signal output terminal, the n-type signal conversion unit is configured to convert an input n-type signal into a high-level n-type signal and output the high-level n-type signal through the high-level n-type signal output terminal, and is further configured to convert an input n-type signal into a low-level n-type signal and output the low-level n-type signal through the low-level n-type signal terminal, and the p-type signal conversion unit is configured to convert an input p-type signal into a high-level p-type signal and output the high-level p-type signal through the high-level p-type signal output terminal, and is further configured to convert an input p-type signal into a low-level p-type signal and output the low-level p-type signal through the low-level p-type signal output terminal;

the amplitude amplification module includes a p-type current source transistor, an n-type current source transistor, a p-type transistor differential pair, an n-type transistor differential pair, and a bias control unit;

the bias control unit is configured to control the p-type current source transistor and the n-type current source transistor to operate in a saturation region;

a first electrode of the p-type current source transistor is electrically connected to a high-level signal terminal, and a second electrode of the p-type current source transistor is electrically connected to two first terminals of the p-type transistor differential pair;

two second terminals of the p-type transistor differential pair are electrically connected to two first terminals of the n-type transistor differential pair respectively, and two input terminals of the p-type transistor differential pair are electrically connected to the low-level p-type signal output terminal and the low-level n-type signal output terminal respectively, so as to enable both p-type transistors of the p-type transistor differential pair to operate in an amplification region;

two second terminals of the n-type transistor differential pair are electrically connected to a first electrode of the n-type current source transistor, and two input terminals of the n-type transistor differential pair are electrically connected to the high-level p-type signal output terminal and the high-level n-type signal output terminal respectively, so as to enable both n-type transistors of the n-type transistor differential pair to operate in an amplification region; and the level conversion module is configured to convert a Current Mode Logic (CML) level signal output from an amplitude amplification module into a Complementary Metal Oxide Semiconductor (CMOS) level signal.

Optionally, the p-type transistor differential pair includes a first p-type transistor and a second p-type transistor, a first electrode of the first p-type transistor is electrically connected to a first electrode of the second p-type transistor, the first electrode of the first p-type transistor and the first electrode of the second p-type transistor are respectively formed into the two first terminals of the p-type transistor differential pair, a second electrode of the first p-type transistor and a second electrode of the second p-type transistor are respectively formed into the two second terminals of the p-type transistor differential pair, a gate electrode of the first p-type transistor and a gate electrode of the second p-type transistor are respectively formed into the two input terminals of the p-type transistor differential pair, the gate electrode of the first p-type transistor is electrically connected to the low-level n-type signal output terminal, and the gate electrode of the second p-type transistor is electrically connected to the low-level p-type signal output terminal.

Optionally, the n-type transistor differential pair includes a first n-type transistor and a second n-type transistor, a first electrode of the first n-type transistor and a first electrode of the second n-type transistor are respectively formed into the two first terminals of the n-type transistor differential pair, the first electrode of the first n-type transistor is electrically connected to the second electrode of the first p-type transistor, and the first electrode of the second n-type transistor is electrically connected to the second electrode of the second p-type transistor;

a second electrode of the first n-type transistor and a second electrode of the second n-type transistor are respectively formed into the two second terminals of the n-type transistor differential pair, and the second electrode of the first n-type transistor is electrically connected to the second electrode of the second n-type transistor; and

a gate electrode of the first n-type transistor and a gate electrode of the second n-type transistor are respectively formed into the two input terminals of the n-type transistor differential pair, the gate electrode of the first n-type transistor is electrically connected to the high-level n-type signal output terminal, and the gate electrode of the second n-type transistor is electrically connected to the high-level p-type signal output terminal.

Optionally, the bias control unit includes a first n-type current mirror transistor, a second n-type current mirror transistor, a third n-type current mirror transistor, a fourth n-type current mirror transistor, a first p-type current mirror transistor, and a second p-type current mirror transistor;

a first electrode of the first n-type current mirror transistor is configured to be electrically connected to a current source, and is electrically connected to a gate electrode of the first n-type current mirror transistor, a second electrode of the first n-type current mirror transistor is electrically connected to a first electrode of the second n-type current mirror transistor, a second electrode of the second n-type current mirror transistor is grounded, a gate electrode of the second n-type current mirror transistor is electrically connected to a gate electrode of the third n-type current mirror transistor and a gate electrode of the n-type current source transistor;

a first electrode of the third n-type current mirror transistor is grounded, and a second electrode of the third n-type current mirror transistor is electrically connected to a first electrode of the fourth n-type current mirror transistor;

a second electrode of the fourth n-type current mirror transistor is electrically connected to a first electrode of the first p-type current mirror transistor, and a gate electrode of the fourth n-type current mirror transistor is electrically connected to the gate electrode of the first n-type current mirror transistor;

a gate electrode of the first p-type current mirror transistor is electrically connected to the first electrode of the first p-type current mirror transistor, and a second electrode of the first p-type current mirror transistor is electrically connected to a first electrode of the second p-type current mirror transistor; and a second electrode of the second p-type current mirror transistor is configured to be electrically connected to a high-level signal terminal, and a gate electrode of the second p-type current mirror transistor is electrically connected to a gate electrode of the p-type current source transistor.

Optionally, the common-mode voltage adjustment module further includes an impedance matching resistor, a first voltage-dividing resistor, and a second voltage-dividing resistor, the impedance matching resistor is connected between a p-port and an n-port of the common-mode voltage adjustment module, and one terminal of the first voltage-dividing resistor is electrically connected to a high-level signal terminal;

the p-type signal conversion unit includes a first coupling capacitor, a third coupling capacitor, and a third resistor, a fifth resistor, a seventh resistor, and a ninth resistor, with the third resistor, the fifth resistor, the seventh resistor, and the ninth resistor connected in series in sequence; one terminal of the third coupling capacitor is electrically connected to the other terminal of the first voltage-dividing resistor, the ninth resistor is electrically connected to one terminal of the second voltage-dividing resistor, a second terminal of the second voltage-dividing resistor is grounded, the first coupling capacitor is connected in parallel with the fifth resistor, the high-level p-type signal output terminal is electrically connected to a junction of the third resistor and the fifth resistor, the third coupling capacitor is connected in parallel with the seventh resistor, the low-level p-type signal output terminal is electrically connected to a junction of the seventh resistor and the ninth resistor, and the p-port is electrically connected to a junction of the fifth resistor and the seventh resistor; and the n-type signal conversion unit includes a second coupling capacitor, a fourth coupling capacitor, and a fourth resistor, a sixth resistor, an eighth resistor, and a tenth resistor, with the fourth resistor, the sixth resistor, the eighth resistor, and the tenth resistor connected in series in sequence; one terminal of the fourth coupling capacitor is electrically connected to the other terminal of the first voltage-dividing resistor, the tenth resistor is electrically connected to one terminal of the second voltage-dividing resistor, the second coupling capacitor is connected in parallel with the sixth resistor, the high-level n-type signal output terminal is electrically connected to a junction of the fourth resistor and the sixth resistor, the fourth coupling capacitor is connected in parallel with the eighth resistor, the low-level n-type signal output terminal is electrically connected to a junction of the eighth resistor and the tenth resistor, and the n-port is electrically connected to a junction of the sixth resistor and the eighth resistor.

Optionally, the level conversion module includes a first inverter, a second inverter, a first feedback component, and a second feedback component;

an input terminal of the first inverter is electrically connected to a p-type signal output terminal of the amplitude amplification module, and an output terminal of the first inverter is formed into an n-type signal output terminal of the clock receiving circuit;

the first feedback component is configured to collect a current output by the first inverter and feed the collected current back to the input terminal;

an input terminal of the second inverter is electrically connected to an n-type signal output terminal of the amplitude amplification module, and an output terminal of the second inverter is formed into a p-type signal output terminal of the clock receiving circuit; and the second feedback component is configured to collect a current output by the second inverter and feed the collected current back to the input terminal of the second inverter.

Optionally, the first feedback component includes a first n-type feedback transistor and a first p-type feedback transistor;

a gate electrode of the first n-type feedback transistor is electrically connected to the output terminal of the first inverter, a first electrode of the first n-type feedback transistor is electrically connected to a high-level signal terminal, and a second electrode of the first n-type transistor is electrically connected to the input terminal of the first inverter; and a gate electrode of the first p-type feedback transistor is electrically connected to the output terminal of the first inverter, a first electrode of the first p-type feedback transistor is grounded, and a second electrode of the first p-type transistor is electrically connected to the input terminal of the first inverter.

Optionally, the second feedback component includes a second n-type feedback transistor and a second p-type feedback transistor;

a gate electrode of the second n-type feedback transistor is electrically connected to the output terminal of the second inverter, a first electrode of the second n-type feedback transistor is electrically connected to a high-level signal terminal, and a second electrode of the second n-type feedback transistor is electrically connected to the input terminal of the second inverter; and a gate electrode of the second p-type feedback transistor is electrically connected to the output terminal of the second inverter, a first electrode of the second p-type feedback transistor is grounded, and a second electrode of the second p-type feedback transistor is electrically connected to the input terminal of the second inverter.

In a second aspect of the present disclosure, there is provided an electronic device, including a clock receiving circuit and a core module, wherein a clock signal input terminal of the core module is electrically connected to an output terminal of the clock receiving circuit, and the clock receiving circuit is the clock receiving circuit provided in the first aspect of the present disclosure.

Optionally, the core module is any one of: an analog-to-digital converter, a digital-to-analog converter, and a phase-locked loop module.

A core component of the clock receiving circuit provided by the embodiments of the present disclosure is the amplitude amplification module, and the p-type transistor differential pair and the n-type transistor differential pair of the amplitude amplification module serve as an input and a load of each other, thus forming a push-pull structure, so that equivalent transconductance of the whole amplitude amplification module is increased, and the amplitude amplification module can provide a relatively large clock output swing at a low power voltage.

Since the clock receiving circuit can provide an enough gain at a low power voltage and thus obtain a relatively large output swing, an output clock of the following core module can be built fast, and influences of noise on the process of building the clock can be reduced or even avoided, so that an output phase noise of the electronic device is relatively small, power consumption of the electronic device is reduced, and performance of the electronic device is improved.

DETAIL DESCRIPTION OF EMBODIMENTS

In order to enable those of ordinary skill in the art to better understand the technical solutions of the present disclosure, a clock receiving circuit and an electronic device provided by the present disclosure will be described in detail below with reference to the drawings.

Exemplary embodiments of the present disclosure will be described more fully below with reference to the drawings, but the exemplary embodiments described herein may be embodied in different forms and should not be interpreted as being limited to the embodiments described herein. The embodiments are provided to make the present disclosure thorough and complete, and are intended to enable those of ordinary skill in the art to fully understand the scope of the present disclosure.

The embodiments described herein and the features therein can be combined with one another if no conflict is incurred.

The term "and/or" used herein includes any and all combinations of one or more associated listed items.

The terms used herein are merely used to describe specific embodiments, and are not intended to limit the present disclosure. As used herein, "a" and "the" which indicate a singular form are intended to include a plural form, unless expressly stated in the context. It should be further understood that the term(s) "include" and/or "be made of" used herein indicate(s) the presence of the described features, integers, operations, elements and/or components, but do not exclude the presence or addition of one or more other features, integers, operations, elements, components and/or combinations thereof.

Unless otherwise defined, all terms (including technical and scientific terms) used herein have the same meaning as commonly understood by those of ordinary skill in the art. It should be further understood that terms, such as those defined in commonly used dictionaries, should be interpreted as having a meaning that is consistent with a meaning in the context of the related technology and the background of the present disclosure, and should not be interpreted in an idealized or overly formal sense unless expressly so defined herein.

Figure 1:
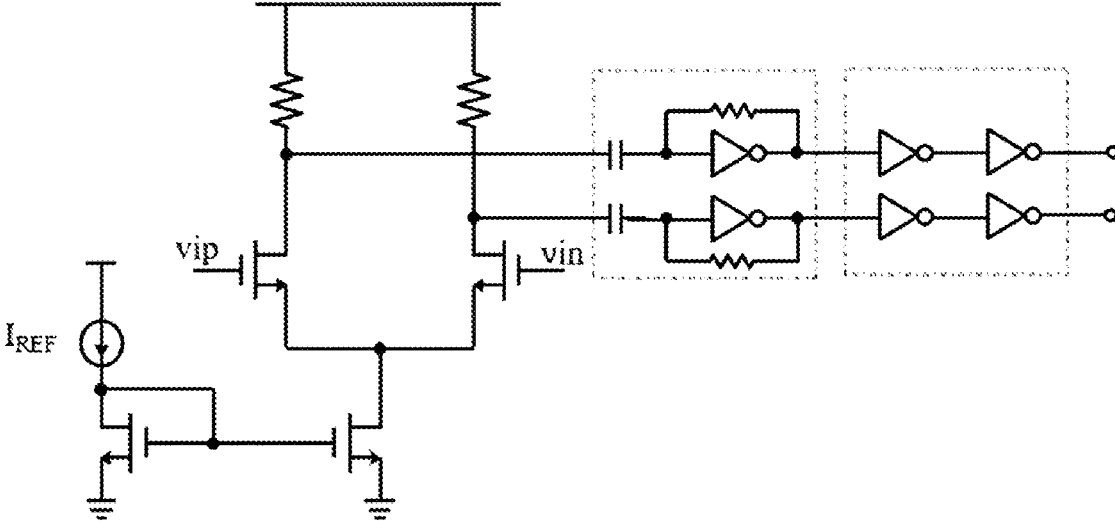
FIG. 1 is a circuit diagram of a clock signal receiving circuit in the related art.
Figure 2:
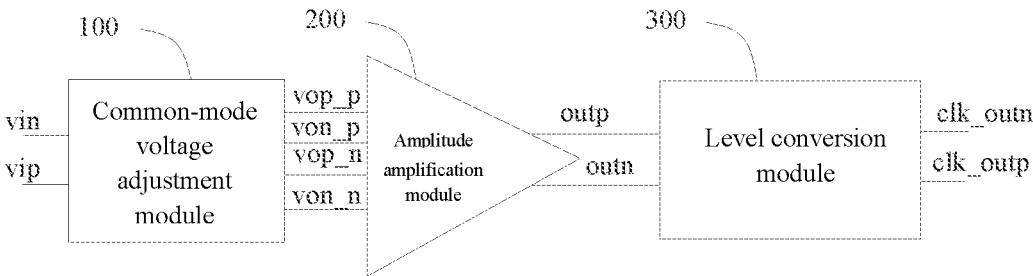
FIG. 2 is a schematic diagram illustrating an implementation of a clock receiving circuit according to the present disclosure.

In an aspect of the present disclosure, there is provided a clock receiving circuit. As shown in FIG. 2, the clock receiving circuit includes a common-mode voltage adjustment module 100, an amplitude amplification module 200, and a level conversion module 300.

Figure 3:
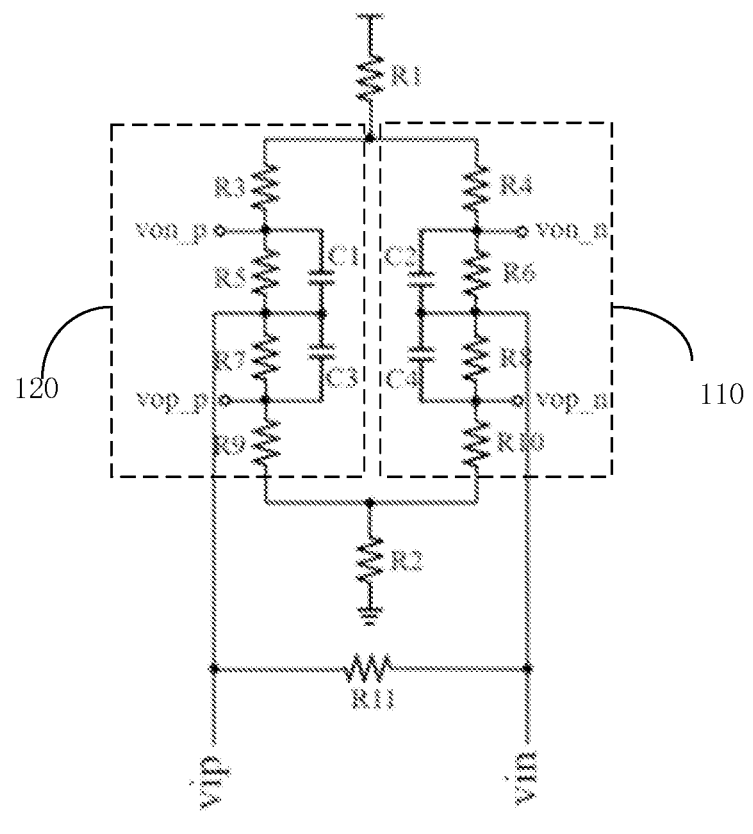
FIG. 3 is a schematic diagram illustrating an implementation of a common-mode
voltage adjustment module in a clock receiving circuit according to the present disclosure.

As shown in FIG. 3, the common-mode voltage adjustment module 100 includes an n-type signal conversion unit 110, a high-level n-type signal output terminal von_n, a low-level n-type signal output terminal vop_n, a p-type signal conversion unit 120, a high-level p-type signal output terminal von_p, and a low-level p-type signal output terminal vop_p.

The n-type signal conversion unit 110 is configured to convert an input n-type signal into a high-level n-type signal and output the high-level n-type signal through the high-level n-type signal output terminal von_n, and is further configured to convert an input n-type signal into a low-level n-type signal and output the low-level n-type signal through the low-level n-type signal terminal vop_n.

The p-type signal conversion unit 120 is configured to convert an input p-type signal into a high-level p-type signal and output the high-level p-type signal through the high-level p-type signal output terminal von_p, and is further configured to convert an input p-type signal into a low-level p-type signal and output the low-level p-type signal through the low-level p-type signal output terminal vop_p.

The amplitude amplification module 200 includes a p-type current source transistor M6, an n-type current source transistor M5, a p-type transistor differential pair 210, an n-type transistor differential pair 220, and a bias control unit 230.

The bias control unit 230 is configured to control the p-type current source transistor M6 and the n-type current source transistor M6 to operate in a saturation region.

A first electrode of the p-type current source transistor M6 is electrically connected to a high-level signal terminal, and a second electrode of the p-type current source transistor M6 is electrically connected to two first terminals of the p-type transistor differential pair 210.

Two second terminals of the p-type transistor differential pair 210 are electrically connected to two first terminals of the n-type transistor differential pair 220 respectively, and two input terminals of the p-type transistor differential pair 210 are electrically connected to the low-level p-type signal output terminal vop_p and the low-level n-type signal output terminal vop_n respectively, so that both p-type transistors of the p-type transistor differential pair can operate in an amplification region.

Two second terminals of the n-type transistor differential pair 220 are electrically connected to a first electrode of the n-type current source transistor M5, and two input terminals of the n-type transistor differential pair 220 are electrically connected to the high-level p-type signal output terminal von_p and the high-level n-type signal output terminal von_n respectively, so that both n-type transistors of the n-type transistor differential pair can operate in an amplification region.

The level conversion module 300 is configured to convert a CML level signal output from an amplitude amplification module into a CMOS level signal.

A core component of the clock receiving circuit provided by the present disclosure is the amplitude amplification module 200, and the p-type transistor differential pair 210 and the n-type transistor differential pair 220 of the amplitude amplification module 200 serve as an input and a load of each other, thus forming a push-pull structure, so that equivalent transconductance of the whole amplitude amplification module 200 is increased, and the amplitude amplification module 200 can provide a relatively large clock output swing at a low power voltage. It should be noted that the p-type transistor differential pair 210 and the n-type transistor differential pair 220 have two connection nodes, which are respectively formed into an n-type signal output terminal voutn and a p-type signal output terminal voup of the amplitude amplification module 200.

The common-mode voltage adjustment module 100 is mainly configured to adjust differential signals received by the clock receiving circuit, and output a signal that enables the transistors of the p-type transistor differential pair 210 and the n-type transistor differential pair 220 of the amplitude amplification module 200 to operate in the amplification region.

The p-type current source transistor M6 and the n-type current source transistor M5 function to supply a driving current to the amplitude amplification module under the control of the bias control unit.

A specific structure of the p-type transistor differential pair is not particularly limited in the present disclosure. In an implementation illustrated by FIG. 4, the p-type transistor differential pair includes a first p-type transistor M4 and a second p-type transistor M3, a first electrode of the first p-type transistor M4 is electrically connected to a first electrode of the second p-type transistor M3, the first electrode of the first p-type transistor M4 and the first electrode of the second p-type transistor M3 are respectively formed into the two first terminals of the p-type transistor differential pair, a second electrode of the first p-type transistor M4 and a second electrode of the second p-type transistor M3 are respectively formed into the two second terminals of the p-type transistor differential pair, a gate electrode of the first p-type transistor M4 and a gate electrode of the second p-type transistor M3 are respectively formed into the two input terminals of the p-type transistor differential pair, the gate electrode (vin_p in FIG. 4) of the first p-type transistor M4 is electrically connected to the low-level n-type signal output terminal vop_p, and the gate electrode (vip_p in FIG. 4) of the second p-type transistor M3 is electrically connected to the low-level p-type signal output terminal.

It should be noted that the second electrode of the first p-type transistor M4 is formed into the n-type signal output terminal of the amplitude amplification module 200, and the second electrode of the second p-type transistor M3 is formed into the p-type signal output terminal of the amplitude amplification module 200.

Figure 4:
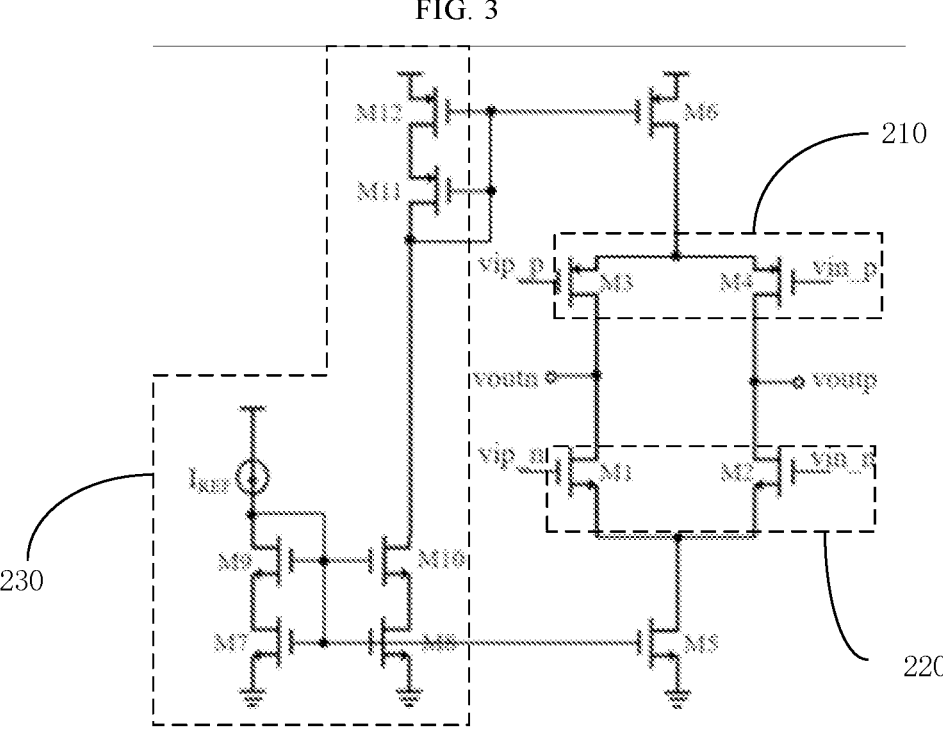
FIG. 4 is a schematic diagram illustrating an implementation of an amplitude amplification module in a clock receiving circuit according to the present disclosure.

A specific structure of the n-type differential transistor pair is also not particularly limited in the present disclosure. As shown in FIG. 4, the n-type transistor differential pair includes a first n-type transistor M2 and a second n-type transistor M1, a first electrode of the first n-type transistor M2 and a first electrode of the second n-type transistor M1 are respectively formed into the two first terminals of the n-type transistor differential pair, the first electrode of the first n-type transistor M2 is electrically connected to the second electrode of the first p-type transistor M4, and the first electrode of the second n-type transistor M1 is electrically connected to the second electrode of the second p-type transistor M3.

A second electrode of the first n-type transistor M2 and a second electrode of the second n-type transistor M1 are respectively formed into the two second terminals of the n-type transistor differential pair, and the second electrode of the first n-type transistor M2 and the second electrode of the second n-type transistor M1 are electrically connected to each other and are both electrically connected to the first electrode of the n-type current source transistor M5.

A gate electrode of the first n-type transistor M2 and a gate electrode of the second n-type transistor M1 are respectively formed into the two input terminals (denoted by vin_n and vip_n in FIG. 4, respectively) of the n-type transistor differential pair, the gate electrode of the first n-type transistor M2 is electrically connected to the high-level n-type signal output terminal, and the gate electrode of the second n-type transistor M1 is electrically connected to the high-level p-type signal output terminal.

A specific structure of the bias control unit 230 is not particularly limited in the present disclosure as long as the bias control unit 230 may bias a gate electrode of the p-type current source transistor M6 and a gate electrode of the n-type current source transistor M5, and enable the p-type current source transistor M6 and the n-type current source transistor M5 to operate in the saturation region.

In the implementation illustrated by FIG. 4, the bias control unit includes a first n-type current mirror transistor M9, a second n-type current mirror transistor M7, a third n-type current mirror transistor M8, a fourth n-type current mirror transistor M10, a first p-type current mirror transistor M11, and a second p-type current mirror transistor M12.

A first electrode of the first n-type current mirror transistor M9 is configured to be electrically connected to a current source (which provides a reference circuit IREF), and is electrically connected to a gate electrode of the first n-type current mirror transistor M9, a second electrode of the first n-type current mirror transistor M9 is electrically connected to a first electrode of the second n-type current mirror transistor M7, a second electrode of the second n-type current mirror transistor M7 is grounded, a gate electrode of the second n-type current mirror transistor M7 is electrically connected to a gate electrode of the third n-type current mirror transistor M8 and the gate electrode of the n-type current source transistor M5.

A first electrode of the third n-type current mirror transistor M8 is grounded, and a second electrode of the third n-type current mirror transistor M8 is electrically connected to a first electrode of the fourth n-type current mirror transistor M10.

A second electrode of the fourth n-type current mirror transistor M10 is electrically connected to a first electrode of the first p-type current mirror transistor M111, and a gate electrode of the fourth n-type current mirror transistor M10 is electrically connected to the gate electrode of the first n-type current mirror transistor M11.

A gate electrode of the first p-type current mirror transistor M11 is electrically connected to the first electrode of the first p-type current mirror transistor M11, and a second electrode of the first p-type current mirror transistor M11 is electrically connected to a first electrode of the second p-type current mirror transistor M12.

A second electrode of the second p-type current mirror transistor M12 is configured to be electrically connected to a high-level signal terminal, and a gate electrode of the second p-type current mirror transistor M12 is electrically connected to the gate electrode of the p-type current source transistor M6.

In the present disclosure, the gate electrode of the n-type current source transistor M5 is electrically connected to the gate electrode of the second n-type current mirror transistor M7, so that a gate voltage of the n-type current source transistor M5 is the same as that of the second n-type current mirror transistor M7. By controlling sizes of the first n-type current source transistor M5 and the second n-type current mirror transistor M7, a gate voltage which enables the n-type current source transistor M5 to operate in the saturation region can be obtained.

Similarly, the gate electrode of the p-type current source transistor M6 is electrically connected to the gate electrode of the second p-type current mirror transistor M12, so that a gate voltage of the p-type current source transistor M6 is the same as that of the second p-type current mirror transistor M12. In the present disclosure, the first n-type current mirror transistor M9, the second n-type current mirror transistor M7, the third n-type current mirror transistor M8, and the fourth n-type current mirror transistor M10 form a current mirror. Thus, a current of the fourth n-type current mirror transistor M10 is proportional to a current of the first n-type current mirror transistor M9, and a current received by the first p-type current mirror transistor M11 is the same as the current of the fourth n-type current mirror transistor M10, and is in a same proportion to the current received by the first electrode of the first n-type current mirror transistor M9 as the fourth n-type current mirror transistor M10. By controlling sizes of the first p-type current mirror transistor M11 and the second p-type current mirror transistor M12, a gate voltage which enables the p-type current source transistor M6 to operate in the saturation region can be obtained.

A specific structure of the common-mode voltage adjustment module 100 is not particularly limited in the present disclosure. As shown in FIG. 3, the common-mode voltage adjustment module further includes an impedance matching resistor R11, a first voltage-dividing resistor R1, and a second voltage-dividing resistor R2, the impedance matching resistor R11 is connected between a p-port vip and an n-port vin of the common-mode voltage adjustment module, and one terminal of the first voltage-dividing resistor R1 is electrically connected to a high-level signal terminal.

The p-type signal conversion unit 120 includes a first coupling capacitor C1, a third coupling capacitor C3, and a third resistor R3, a fifth resistor R5, a seventh resistor R7, and a ninth resistor R9, with the third resistor R3, the fifth resistor R5, the seventh resistor R7, and the ninth resistor R9 connected in series in sequence. One terminal of the third coupling capacitor C3 is electrically connected to the other terminal of the first voltage-dividing resistor R1, the ninth resistor R9 is electrically connected to one terminal of the second voltage-dividing resistor R2, a second terminal of the second voltage-dividing resistor R2 is grounded, the first coupling capacitor C1 is connected in parallel with the fifth resistor R5, the high-level p-type signal output terminal von_p is electrically connected to a junction of the third resistor R3 and the fifth resistor R5, the third coupling capacitor C3 is connected in parallel with the seventh resistor R7, the low-level p-type signal output terminal vop_p is electrically connected to a junction of the seventh resistor R7 and the ninth resistor R9, and the p-port vip is electrically connected to a junction of the fifth resistor R5 and the seventh resistor R7.

The n-type signal conversion unit 110 includes a second coupling capacitor C2, a fourth coupling capacitor C4, and a fourth resistor R4, a sixth resistor R6, an eighth resistor R8, and a tenth resistor R10, with the fourth resistor R4, the sixth resistor R6, the eighth resistor R8, and the tenth resistor R10 connected in series in sequence. One terminal of the fourth coupling capacitor C4 is electrically connected to the other terminal of the first voltage-dividing resistor R1, the tenth resistor R10 is electrically connected to one terminal of the second voltage-dividing resistor R2, the second coupling capacitor C2 is connected in parallel with the sixth resistor R6, the high-level n-type signal output terminal von_n is electrically connected to a junction of the fourth resistor R4 and the sixth resistor R6, the fourth coupling capacitor C4 is connected in parallel with the eighth resistor R8, the low-level n-type signal output terminal vop_n is electrically connected to a junction of the eighth resistor R8 and the tenth resistor R10, and the n-port vin is electrically connected to a junction of the sixth resistor R6 and the eighth resistor R8.

In the present disclosure, a resistor chain is adopted to adjust a common-mode voltage, and resistance values can be flexibly adjusted according to application scenarios to change the common-mode voltage, so that flexibility of the circuit is improved.

Figure 5:
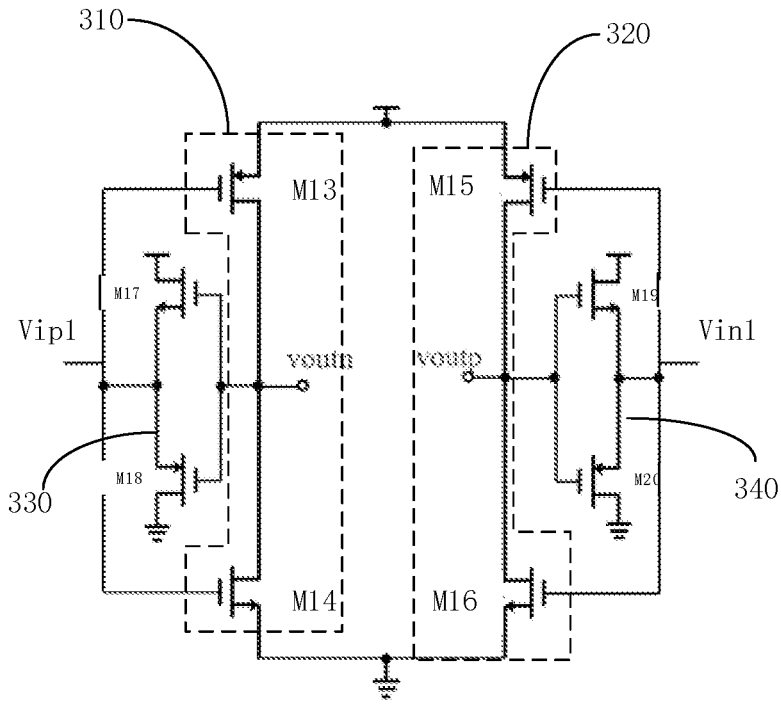
FIG. 5 is a schematic diagram illustrating an implementation of a level conversion module in a clock receiving circuit according to the present disclosure.

A specific structure of the level conversion module 300 is not particularly limited in the present disclosure. For example, as shown in FIG. 5, the level conversion module includes a first inverter 310, a second inverter 320, a first feedback component 330, and a second feedback component 340.

An input terminal vip1 of the first inverter 310 is electrically connected to the p-type signal output terminal of the amplitude amplification module 200, and an output terminal of the first inverter 310 is formed into an n-type signal output terminal voutn1 of the clock receiving circuit.

The first feedback component 330 is configured to collect an output signal of the first inverter 310 and feed the collected signal back to the input terminal of the first inverter 310, so as to perform coarse calibration on the output of the first inverter 310.

An input terminal vin1 of the second inverter 320 is electrically connected to the n-type signal output terminal of the amplitude amplification module 200, and an output terminal of the second inverter 320 is formed into a p-type signal output terminal voutn2 of the clock receiving circuit.

The second feedback component 340 is configured to collect an output signal of the second inverter 320 and feed the collected signal back to the input terminal of the second inverter 320, so as to perform coarse calibration on the output of the second inverter 320.

In an implementation illustrated by FIG. 5, the first inverter 310 includes a first p-type transistor M13 and a first n-type transistor M14. A first electrode of the first p-type transistor M13 is electrically connected to a high-level signal terminal, a gate electrode of the first p-type transistor M13 is electrically connected to the input terminal vip1 of the first inverter 310, a second electrode of the first p-type transistor M13 is electrically connected to a first electrode of the first n-type transistor M14 and the output terminal of the first inverter 310, a second electrode of the first n-type transistor is grounded, and a gate electrode of the first n-type transistor is electrically connected to the input terminal vip1 of the first inverter 310.

In the implementation illustrated by FIG. 5, the second inverter 320 includes a second p-type transistor M15 and a second n-type transistor M16. A first electrode of the second p-type transistor M15 is electrically connected to the high-level signal terminal, a gate electrode of the second p-type transistor M15 is electrically connected to the input terminal vin1 of the second inverter 320, a second electrode of the second p-type transistor M15 is electrically connected to a first electrode of the second n-type transistor M16 and the output terminal of the second inverter 320, a second electrode of the second n-type transistor M16 is grounded, and a gate electrode of the second n-type transistor M16 is electrically connected to the input terminal vin1 of the second inverter 320.

A specific structure of the first feedback component 330 is not particularly limited in the present disclosure. As shown in FIG. 5, the first feedback component 330 includes a first n-type feedback transistor M17 and a first p-type feedback transistor M18.

A gate electrode of the first n-type feedback transistor M17 is electrically connected to the output terminal of the first inverter 310, a first electrode of the first n-type feedback transistor M17 is electrically connected to a high-level signal terminal, and a second electrode of the first n-type transistor M17 is electrically connected to the input terminal of the first inverter 330.

A gate electrode of the first p-type feedback transistor M18 is electrically connected to the output terminal of the first inverter 310, a first electrode of the first p-type feedback transistor M18 is grounded, and a second electrode of the first p-type transistor M18 is electrically connected to the input terminal of the first inverter 330.

Both the first n-type feedback transistor M17 and the first p-type feedback transistor M18 are elements which are turned on under the control of a voltage, and do not generate any power consumption when an on condition is not satisfied. Thus, the first feedback component including the first n-type feedback transistor M17 and the first p-type feedback transistor M18 can reduce overall power consumption of the clock receiving circuit.

A specific structure of the second feedback component 340 is not particularly limited in the present disclosure. As shown in FIG. 5, optionally, the second feedback component 340 may include a second n-type feedback transistor M19 and a second p-type feedback transistor M20.

A gate electrode of the second n-type feedback transistor M19 is electrically connected to the output terminal of the second inverter 320, a first electrode of the second n-type feedback transistor M19 is electrically connected to a high-level signal terminal, and a second electrode of the second n-type feedback transistor M19 is electrically connected to the input terminal of the second inverter.

A gate electrode of the second p-type feedback transistor M20 is electrically connected to the output terminal of the second inverter 320, a first electrode of the second p-type feedback transistor M20 is grounded, and a second electrode of the second p-type feedback transistor M20 is electrically connected to the input terminal of the second inverter 320.

Both the second n-type feedback transistor M19 and the second p-type feedback transistor M29 are elements which are turned on under the control of a voltage, and do not generate any power consumption when an on condition is not satisfied. Thus, the first feedback component including the second n-type feedback transistor M19 and the second p-type feedback transistor M20 can reduce the overall power consumption of the clock receiving circuit.

By adopting the first feedback component 330 including the first n-type feedback transistor M17 and the first p-type feedback transistor M18 and the second feedback component 340 including the second n-type feedback transistor M19 and the second p-type feedback transistor M20, the overall power consumption can be reduced, and a layout of the clock receiving circuit is simpler, and an occupied area of the clock receiving circuit is smaller, which can improve overall integration of the clock receiving circuit.

In a second aspect of the present disclosure, there is provided an electronic device, including a clock receiving circuit and a core module having a clock signal input terminal electrically connected to an output terminal of the clock receiving circuit.

Since the clock receiving circuit can provide an enough gain at a low power voltage and thus obtain a relatively large output swing, an output clock of the following core module can be built fast, and influences of noise on the process of building the clock can be reduced or even avoided, so that an output phase noise of the electronic device is relatively small, power consumption of the electronic device is reduced, and performance of the electronic device is improved.

The core module is not particularly limited in the present disclosure. Optionally, the core module is any one of the following devices: an analog-to-digital converter, a digital-to-analog converter, a phase-locked loop module.

Figure 6:
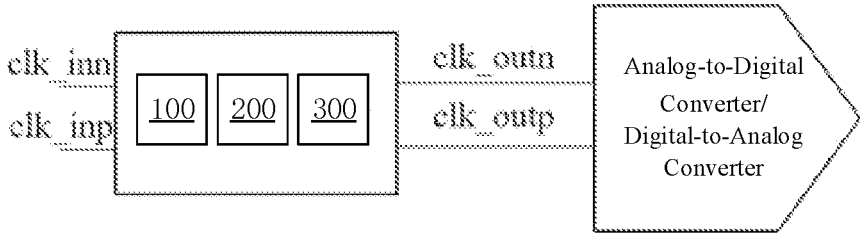
FIG. 6 is a schematic diagram illustrating a case where a core module of an electronic device is a digital-to-analog converter or an analog-to-digital converter.
Figure 7:
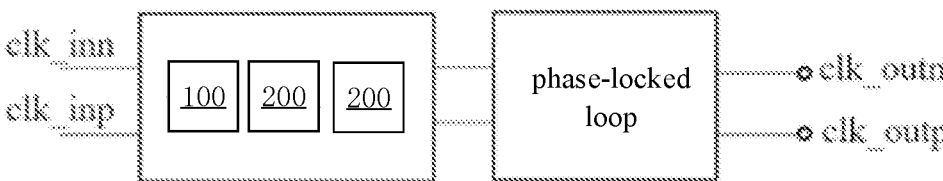
FIG. 7 is a schematic diagram illustrating a case where a core module of an electronic device is a phase-locked loop circuit.

FIG. 6 illustrates a case where the core module is a digital-to-analog converter or an analog-to-digital converter, and FIG. 7 illustrates a case where the core module is a phase-locked loop module.

The present disclosure discloses the exemplary embodiments using specific terms, but the terms are merely used and should be merely interpreted as having general illustrative meanings, rather than for the purpose of limitation. Unless expressly stated, it is apparent to those of ordinary skill in the art that features, characteristics and/or elements described in connection with a particular embodiment can be used alone or in combination with features, characteristics and/or elements described in connection with other embodiments. Therefore. it should be understood by those of ordinary skill in the art that various changes in the forms and the details can be made without departing from the scope of the present disclosure of the appended claims.

What is claimed is:

1. A clock receiving circuit, comprising a common-mode voltage adjustment module, an amplitude amplification module, and a level conversion module, wherein the common-mode voltage adjustment module comprises an n-type signal conversion unit, a high-level n-type signal output terminal, a low-level n-type signal output terminal, a p-type signal conversion unit, a high-level p-type signal output terminal, and a low-level p-type signal output terminal, wherein the n-type signal conversion unit is configured to convert an input n-type signal into a high-level n-type signal and output the high-level n-type signal through the high-level n-type signal output terminal, and is further configured to convert an input n-type signal into a low-level n-type signal and output the low-level n-type signal through the low-level n-type signal terminal, and the p-type signal conversion unit is configured to convert an input p-type signal into a high-level p-type signal and output the high-level p-type signal through the high-level p-type signal output terminal, and is further configured to convert an input p-type signal into a low-level p-type signal and output the low-level p-type signal through the low-level p-type signal output terminal;

the amplitude amplification module comprises a p-type current source transistor, an n-type current source transistor, a p-type transistor differential pair, an n-type transistor differential pair, and a bias control unit;

the bias control unit is configured to control the p-type current source transistor and the n-type current source transistor to operate in a saturation region;

a first electrode of the p-type current source transistor is electrically connected to a high-level signal terminal, and a second electrode of the p-type current source transistor is electrically connected to two first terminals of the p-type transistor differential pair;

two second terminals of the p-type transistor differential pair are electrically connected to two first terminals of the n-type transistor differential pair respectively, and two input terminals of the p-type transistor differential pair are electrically connected to the low-level p-type signal output terminal and the low-level n-type signal output terminal respectively, so as to enable both p-type transistors of the p-type transistor differential pair to operate in an amplification region;

two second terminals of the n-type transistor differential pair are electrically connected to a first electrode of the n-type current source transistor, and two input terminals of the n-type transistor differential pair are electrically connected to the high-level p-type signal output terminal and the high-level n-type signal output terminal respectively, so as to enable both n-type transistors of the n-type transistor differential pair to operate in an amplification region; and the level conversion module is configured to convert a Current Mode Logic (CML) level signal output from an amplitude amplification module into a Complementary Metal Oxide Semiconductor (CMOS) level signal, wherein the common-mode voltage adjustment module further comprises an impedance matching resistor, a first voltage-dividing resistor, and a second voltage-dividing resistor, wherein the impedance matching resistor is connected between a p-port and an n-port of the common-mode voltage adjustment module, and one terminal of the first voltage-dividing resistor is electrically connected to a high-level signal terminal;

the p-type signal conversion unit comprises a first coupling capacitor, a third coupling capacitor, and a third resistor, a fifth resistor, a seventh resistor, and a ninth resistor, with the third resistor, the fifth resistor, the seventh resistor, and the ninth resistor connected in series in sequence; one terminal of the third resistor is electrically connected to the other terminal of the first voltage-dividing resistor, the ninth resistor is electrically connected to one terminal of the second voltage-dividing resistor, a second terminal of the second voltage-dividing resistor is grounded, the first coupling capacitor is connected in parallel with the fifth resistor, the high-level p-type signal output terminal is electrically connected to a junction of the third resistor and the fifth resistor, the third coupling capacitor is connected in parallel with the seventh resistor, the low-level p-type signal output terminal is electrically connected to a junction of the seventh resistor and the ninth resistor, and the p-port is electrically connected to a junction of the fifth resistor and the seventh resistor; and the n-type signal conversion unit comprises a second coupling capacitor, a fourth coupling capacitor, and a fourth resistor, a sixth resistor, an eighth resistor, and a tenth resistor, with the fourth resistor, the sixth resistor, the eighth resistor, and the tenth resistor connected in series in sequence; one terminal of the fourth resistor is electrically connected to the other terminal of the first voltage-dividing resistor, the tenth resistor is electrically connected to one terminal of the second voltage-dividing resistor, the second coupling capacitor is connected in parallel with the sixth resistor, the high-level n-type signal output terminal is electrically connected to a junction of the fourth resistor and the sixth resistor, the fourth coupling capacitor is connected in parallel with the eighth resistor, the low-level n-type signal output terminal is electrically connected to a junction of the eighth resistor and the tenth resistor, and the n-port is electrically connected to a junction of the sixth resistor and the eighth resistor.

2. The clock receiving circuit of claim 1, wherein the p-type transistor differential pair comprises a first p-type transistor and a second p-type transistor, a first electrode of the first p-type transistor is electrically connected to a first electrode of the second p-type transistor, the first electrode of the first p-type transistor and the first electrode of the second p-type transistor are respectively formed into the two first terminals of the p-type transistor differential pair, a second electrode of the first p-type transistor and a second electrode of the second p-type transistor are respectively formed into the two second terminals of the p-type transistor differential pair, a gate electrode of the first p-type transistor and a gate electrode of the second p-type transistor are respectively formed into the two input terminals of the p-type transistor differential pair, the gate electrode of the first p-type transistor is electrically connected to the low-level n-type signal output terminal, and the gate electrode of the second p-type transistor is electrically connected to the low-level p-type signal output terminal.

3. The clock receiving circuit of claim 2, wherein the n-type transistor differential pair comprises a first n-type transistor and a second n-type transistor, a first electrode of the first n-type transistor and a first electrode of the second n-type transistor are respectively formed into the two first terminals of the n-type transistor differential pair, the first electrode of the first n-type transistor is electrically connected to the second electrode of the first p-type transistor, and the first electrode of the second n-type transistor is electrically connected to the second electrode of the second p-type transistor;

a second electrode of the first n-type transistor and a second electrode of the second n-type transistor are respectively formed into the two second terminals of the n-type transistor differential pair, and the second electrode of the first n-type transistor is electrically connected to the second electrode of the second n-type transistor; and a gate electrode of the first n-type transistor and a gate electrode of the second n-type transistor are respectively formed into the two input terminals of the n-type transistor differential pair, the gate electrode of the first n-type transistor is electrically connected to the high-level n-type signal output terminal, and the gate electrode of the second n-type transistor is electrically connected to the high-level p-type signal output terminal.

4. The clock receiving circuit of claim 3, wherein the bias control unit comprises a first n-type current mirror transistor, a second n-type current mirror transistor, a third n-type current mirror transistor, a fourth n-type current mirror transistor, a first p-type current mirror transistor, and a second p-type current mirror transistor;

a first electrode of the first n-type current mirror transistor is configured to be electrically connected to a current source, and is electrically connected to a gate electrode of the first n-type current mirror transistor, a second electrode of the first n-type current mirror transistor is electrically connected to a first electrode of the second n-type current mirror transistor, a second electrode of the second n-type current mirror transistor is grounded, a gate electrode of the second n-type current mirror transistor is electrically connected to a gate electrode of the third n-type current mirror transistor and a gate electrode of the n-type current source transistor;

a first electrode of the third n-type current mirror transistor is grounded, and a second electrode of the third n-type current mirror transistor is electrically connected to a first electrode of the fourth n-type current mirror transistor;

a second electrode of the fourth n-type current mirror transistor is electrically connected to a first electrode of the first p-type current mirror transistor, and a gate electrode of the fourth n-type current mirror transistor is electrically connected to the gate electrode of the first n-type current mirror transistor;

a gate electrode of the first p-type current mirror transistor is electrically connected to the first electrode of the first p-type current mirror transistor, and a second electrode of the first p-type current mirror transistor is electrically connected to a first electrode of the second p-type current mirror transistor; and a second electrode of the second p-type current mirror transistor is configured to be electrically connected to a high-level signal terminal, and a gate electrode of the second p-type current mirror transistor is electrically connected to a gate electrode of the p-type current source transistor.

5. The clock receiving circuit of claim 3, wherein the level conversion module comprises a first inverter, a second inverter, a first feedback component, and a second feedback component;

an input terminal of the first inverter is electrically connected to a p-type signal output terminal of the amplitude amplification module, and an output terminal of the first inverter is formed into an n-type signal output terminal of the clock receiving circuit;

the first feedback component is configured to collect a current output by the first inverter and feed the collected current back to the input terminal;

an input terminal of the second inverter is electrically connected to an n-type signal output terminal of the amplitude amplification module, and an output terminal of the second inverter is formed into a p-type signal output terminal of the clock receiving circuit; and the second feedback component is configured to collect a current output by the second inverter and feed the collected current back to the input terminal of the second inverter.

6. The clock receiving circuit of claim 2, wherein the bias control unit comprises a first n-type current mirror transistor, a second n-type current mirror transistor, a third n-type current mirror transistor, a fourth n-type current mirror transistor, a first p-type current mirror transistor, and a second p-type current mirror transistor;

a first electrode of the first n-type current mirror transistor is configured to be electrically connected to a current source, and is electrically connected to a gate electrode of the first n-type current mirror transistor, a second electrode of the first n-type current mirror transistor is electrically connected to a first electrode of the second n-type current mirror transistor, a second electrode of the second n-type current mirror transistor is grounded, a gate electrode of the second n-type current mirror transistor is electrically connected to a gate electrode of the third n-type current mirror transistor and a gate electrode of the n-type current source transistor;

a first electrode of the third n-type current mirror transistor is grounded, and a second electrode of the third n-type current mirror transistor is electrically connected to a first electrode of the fourth n-type current mirror transistor;

a second electrode of the fourth n-type current mirror transistor is electrically connected to a first electrode of the first p-type current mirror transistor, and a gate electrode of the fourth n-type current mirror transistor is electrically connected to the gate electrode of the first n-type current mirror transistor;

a gate electrode of the first p-type current mirror transistor is electrically connected to the first electrode of the first p-type current mirror transistor, and a second electrode of the first p-type current mirror transistor is electrically connected to a first electrode of the second p-type current mirror transistor; and a second electrode of the second p-type current mirror transistor is configured to be electrically connected to a high-level signal terminal, and a gate electrode of the second p-type current mirror transistor is electrically connected to a gate electrode of the p-type current source transistor.

7. The clock receiving circuit of claim 2, wherein the level conversion module comprises a first inverter, a second inverter, a first feedback component, and a second feedback component;

an input terminal of the first inverter is electrically connected to a p-type signal output terminal of the amplitude amplification module, and an output terminal of the first inverter is formed into an n-type signal output terminal of the clock receiving circuit;

the first feedback component is configured to collect a current output by the first inverter and feed the collected current back to the input terminal;

an input terminal of the second inverter is electrically connected to an n-type signal output terminal of the amplitude amplification module, and an output terminal of the second inverter is formed into a p-type signal output terminal of the clock receiving circuit; and the second feedback component is configured to collect a current output by the second inverter and feed the collected current back to the input terminal of the second inverter.

8. The clock receiving circuit of claim 1, wherein the bias control unit comprises a first n-type current mirror transistor, a second n-type current mirror transistor, a third n-type current mirror transistor, a fourth n-type current mirror transistor, a first p-type current mirror transistor, and a second p-type current mirror transistor;

a first electrode of the first n-type current mirror transistor is configured to be electrically connected to a current source, and is electrically connected to a gate electrode of the first n-type current mirror transistor, a second electrode of the first n-type current mirror transistor is electrically connected to a first electrode of the second n-type current mirror transistor, a second electrode of the second n-type current mirror transistor is grounded, a gate electrode of the second n-type current mirror transistor is electrically connected to a gate electrode of the third n-type current mirror transistor and a gate electrode of the n-type current source transistor;

a first electrode of the third n-type current mirror transistor is grounded, and a second electrode of the third n-type current mirror transistor is electrically connected to a first electrode of the fourth n-type current mirror transistor;

a second electrode of the fourth n-type current mirror transistor is electrically connected to a first electrode of the first p-type current mirror transistor, and a gate electrode of the fourth n-type current mirror transistor is electrically connected to the gate electrode of the first n-type current mirror transistor;

a gate electrode of the first p-type current mirror transistor is electrically connected to the first electrode of the first p-type current mirror transistor, and a second electrode of the first p-type current mirror transistor is electrically connected to a first electrode of the second p-type current mirror transistor; and a second electrode of the second p-type current mirror transistor is configured to be electrically connected to a high-level signal terminal, and a gate electrode of the second p-type current mirror transistor is electrically connected to a gate electrode of the p-type current source transistor.

9. The clock receiving circuit of claim 1, wherein the level conversion module comprises a first inverter, a second inverter, a first feedback component, and a second feedback component;

an input terminal of the first inverter is electrically connected to a p-type signal output terminal of the amplitude amplification module, and an output terminal of the first inverter is formed into an n-type signal output terminal of the clock receiving circuit;

the first feedback component is configured to collect a current output by the first inverter and feed the collected current back to the input terminal;

an input terminal of the second inverter is electrically connected to an n-type signal output terminal of the amplitude amplification module, and an output terminal of the second inverter is formed into a p-type signal output terminal of the clock receiving circuit; and the second feedback component is configured to collect a current output by the second inverter and feed the collected current back to the input terminal of the second inverter.

10. The clock receiving circuit of claim 9, wherein the first feedback component comprises a first n-type feedback transistor and a first p-type feedback transistor;

a gate electrode of the first n-type feedback transistor is electrically connected to the output terminal of the first inverter, a first electrode of the first n-type feedback transistor is electrically connected to a high-level signal terminal, and a second electrode of the first n-type transistor is electrically connected to the input terminal of the first inverter; and a gate electrode of the first p-type feedback transistor is electrically connected to the output terminal of the first inverter, a first electrode of the first p-type feedback transistor is grounded, and a second electrode of the first p-type transistor is electrically connected to the input terminal of the first inverter.

11. The clock receiving circuit of claim 9, wherein the second feedback component comprises a second n-type feedback transistor and a second p-type feedback transistor;

a gate electrode of the second n-type feedback transistor is electrically connected to the output terminal of the second inverter, a first electrode of the second n-type feedback transistor is electrically connected to a high-level signal terminal, and a second electrode of the second n-type feedback transistor is electrically connected to the input terminal of the second inverter; and a gate electrode of the second p-type feedback transistor is electrically connected to the output terminal of the second inverter, a first electrode of the second p-type feedback transistor is grounded, and a second electrode of the second p-type feedback transistor is electrically connected to the input terminal of the second inverter.

12. An electronic device, comprising a clock receiving circuit and a core module, wherein a clock signal input terminal of the core module is electrically connected to an output terminal of the clock receiving circuit, and the clock receiving circuit is the clock receiving circuit of claim 1.

13. The electronic device of claim 12, wherein the core module is any one of:

an analog-to-digital converter, a digital-to-analog converter, and a phase-locked loop module.

* * * * *